US010388576B2

(12) United States Patent
Basker et al.

(10) Patent No.: US 10,388,576 B2
(45) Date of Patent: Aug. 20, 2019

(54) SEMICONDUCTOR DEVICE INCLUDING DUAL TRENCH EPITAXIAL DUAL-LINER CONTACTS

(71) Applicant: International Business Machines Corporation, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/198,654

(22) Filed: Jun. 30, 2016

(65) Prior Publication Data
US 2018/0005903 A1    Jan. 4, 2018

(51) Int. Cl.
H01L 27/092    (2006.01)
H01L 21/8238   (2006.01)
(Continued)

(52) U.S. Cl.
CPC ........... H01L 21/823871 (2013.01); H01L 21/76895 (2013.01); H01L 21/76897 (2013.01);
(Continued)

(58) Field of Classification Search
CPC ..... H01L 21/823475; H01L 21/823871; H01L 21/76886; H01L 21/823828;
(Continued)

(56) References Cited

U.S. PATENT DOCUMENTS 6,946,696 B2    9/2005   Chan et al.
7,064,066 B1 *  6/2006   Metz ............... H01L 21/28088
                                                257/E21.637
(Continued)

OTHER PUBLICATIONS

Haran et al., "Dual Liner Silicide," U.S. Appl. No. 14/740,987, filed Jun. 16, 2015.

*Primary Examiner* — Meiya Li
*Assistant Examiner* — Shih Tsun A Chou
(74) *Attorney, Agent, or Firm* — Cantor Colburn LLP; Vazken Alexanian

(57) ABSTRACT

A complementary metal-oxide-semiconductor field-effect transistor (CMOS) device includes a first source/drain (S/D) region and a second S/D region different from the first S/D region. A first epitaxy film formed of a first semiconductor material is on the first S/D region. A second epitaxy film formed of a second semiconductor material is on the second S/D region. The CMOS device further includes first and second S/D contact stacks. The first S/D contact stack includes a first contact trench liner having a first inner side wall extending from a first base portion to an upper surface of the first S/D contact stack. The second S/D contact stack includes a second contact trench liner having a second inner side wall extending from a second base portion to an upper surface of the second S/D contact stack. The first inner sidewall directly contacts the second inner sidewall.

17 Claims, 9 Drawing Sheets

(51) Int. Cl.
*H01L 23/485* (2006.01)
*H01L 21/768* (2006.01)

(52) U.S. Cl.
CPC .... *H01L 21/823814* (2013.01); *H01L 23/485* (2013.01); *H01L 27/092* (2013.01); *H01L 21/76843* (2013.01)

(58) Field of Classification Search
CPC ......... H01L 21/823842; H01L 21/8238; H01L 21/76841; H01L 21/76843; H01L 21/823814
See application file for complete search history.

(56) References Cited

U.S. PATENT DOCUMENTS

| | | | | |
|---|---|---|---|---|
| 7,208,361 | B2* | 4/2007 | Shah | H01L 21/84 257/204 |
| 8,110,877 | B2* | 2/2012 | Mukherjee | H01L 21/28512 257/288 |
| 8,372,703 | B2* | 2/2013 | Kirkpatrick | H01L 21/823842 257/E21.637 |
| 8,569,152 | B1 | 10/2013 | Basker et al. | |
| 8,754,417 | B2 | 6/2014 | Christensen et al. | |
| 9,093,466 | B2 | 7/2015 | Pei et al. | |
| 9,299,706 | B1 | 3/2016 | Jagannathan et al. | |
| 9,390,981 | B1* | 7/2016 | Basker | H01L 21/823814 |
| 9,478,468 | B1* | 10/2016 | Cheng | H01L 21/823871 |
| 9,502,308 | B1* | 11/2016 | Park | H01L 21/823871 |
| 9,589,851 | B2* | 3/2017 | Bu | H01L 21/823871 |
| 9,613,817 | B1* | 4/2017 | Bentley | H01L 21/28518 |
| 9,613,855 | B1* | 4/2017 | Patil | H01L 21/823814 |
| 9,805,973 | B2* | 10/2017 | Adusumilli | H01L 21/76846 |
| 2002/0058374 | A1* | 5/2002 | Kim | H01L 21/823842 438/228 |
| 2005/0221612 | A1* | 10/2005 | Brown | H01L 21/76843 438/643 |
| 2006/0008968 | A1* | 1/2006 | Brask | H01L 21/28185 438/206 |
| 2006/0051957 | A1* | 3/2006 | Brask | H01L 21/28114 438/637 |
| 2006/0071285 | A1* | 4/2006 | Datta | H01L 21/823807 257/407 |
| 2006/0163670 | A1 | 7/2006 | Ellis-Monaghan et al. | |
| 2006/0220141 | A1* | 10/2006 | Besser | H01L 21/28518 257/371 |
| 2006/0237801 | A1* | 10/2006 | Kavalieros | H01L 21/823807 257/388 |
| 2007/0123042 | A1 | 5/2007 | Rim et al. | |
| 2010/0123198 | A1* | 5/2010 | Kim | H01L 21/26506 257/377 |
| 2010/0164006 | A1* | 7/2010 | Kirkpatrick | H01L 21/823842 257/369 |
| 2011/0147855 | A1 | 6/2011 | Joshi et al. | |
| 2012/0074501 | A1* | 3/2012 | Ellis-Monaghan | H01L 21/823807 257/369 |
| 2012/0292710 | A1* | 11/2012 | Cheng | H01L 21/823842 257/369 |
| 2013/0140641 | A1* | 6/2013 | Chuang | H01L 21/823842 257/369 |
| 2013/0316532 | A1* | 11/2013 | Zhou | H01L 21/76843 438/653 |
| 2014/0001474 | A1* | 1/2014 | Hong | H01L 21/8238 257/57 |
| 2014/0084377 | A1* | 3/2014 | Zhang | H01L 23/485 257/369 |
| 2014/0306290 | A1* | 10/2014 | Alptekin | H01L 29/41725 257/369 |
| 2014/0361375 | A1* | 12/2014 | Deniz | H01L 21/283 257/369 |
| 2015/0011060 | A1* | 1/2015 | Loubet | H01L 29/161 438/218 |
| 2015/0048456 | A1* | 2/2015 | Chuang | H01L 21/823828 257/368 |
| 2015/0069518 | A1* | 3/2015 | Han | H01L 27/092 257/369 |
| 2015/0091093 | A1* | 4/2015 | Bouche | H01L 29/41725 257/369 |
| 2015/0102491 | A1* | 4/2015 | Miyazaki | H01L 29/45 257/751 |
| 2015/0214228 | A1* | 7/2015 | Koh | H01L 27/0924 257/369 |
| 2015/0243660 | A1* | 8/2015 | Liu | H01L 27/092 257/369 |
| 2015/0270179 | A1* | 9/2015 | Alptekin | H01L 21/28512 257/757 |
| 2015/0333082 | A1 | 11/2015 | Chuang et al. | |
| 2015/0348788 | A1* | 12/2015 | Liu | H01L 29/66545 257/392 |
| 2015/0364378 | A1* | 12/2015 | Xie | H01L 21/823437 257/368 |
| 2015/0380305 | A1* | 12/2015 | Basker | H01L 21/76846 257/77 |
| 2016/0111339 | A1* | 4/2016 | Zang | H01L 21/823814 257/369 |
| 2016/0329253 | A1* | 11/2016 | Liu | H01L 21/823821 |
| 2016/0351566 | A1* | 12/2016 | Niimi | H01L 21/823418 |
| 2017/0053918 | A1* | 2/2017 | Cheng | H01L 21/823871 |
| 2017/0125306 | A1* | 5/2017 | Adusumilli | H01L 21/823871 |

* cited by examiner

SEMICONDUCTOR DEVICE INCLUDING DUAL TRENCH EPITAXIAL DUAL-LINER CONTACTS

BACKGROUND

The present invention relates generally to semiconductor devices, and more specifically, to complementary metal-oxide-semiconductor field-effect transistor (MOSFET or MOS) devices.

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS) in which a gate structure is energized to create an electric field that drives electrons through a channel region located between a source region and a drain region of the semiconductor body. CMOS devices have become widely used in the semiconductor industry, wherein both n-type (NMOS) and p-type (PMOS) transistors are used to fabricate logic and other circuitry.

Generally, after a transistor is formed, electrical contacts are made to connect a source region, a drain region, and/or a gate region of the transistor to make the transistor fully functional. Typically, lithographic techniques are used to define contact openings in a dielectric material that surrounds the transistor for the electrical contacts. The contact openings are then filled with a conductive material to form electrical contacts. As device footprints are reduced, increased contact resistance to the source region and the drain region (hereinafter collectively referred to as "source/drain regions") affects device performance. Silicide liners can be utilized to reduce the contact resistance between the conductive material and the source/drain regions in FETs. For example, nickel platinum (NiPt) silicide liners have proven to improve on-resistance (RON) for p-type devices. When fabricating CMOS devices, silicide liners are not only utilized with the PMOS transistors but are also utilized with the NMOS transistors.

SUMMARY

According to a non-limiting embodiment of the present invention, a method of forming contact trench liners in a complementary metal-oxide-semiconductor field-effect transistor (CMOS) device comprises forming a first contact trench over a first source/drain (S/D) region of a n-type transistor (NFET), and forming a second contact trench over a second S/D region of a p-type transistor (PFET). The method further includes depositing a first contact trench liner comprising a first liner material in the first contact trench without depositing the first contact trench liner in the second contact trench, and depositing a first S/D conductive contact material in the first contact trench. After depositing the first contact trench liner, a second contact trench liner comprising a second liner material is deposited in the second contact trench, and a second S/D conductive contact material is deposited in the second contact trench. The second liner material is different than the first liner material.

According to another non-limiting embodiment, a method of forming source/drain (S/D) contact stacks in a complementary metal-oxide-semiconductor field-effect transistor (CMOS) device comprises forming a first contact trench over a first source/drain (S/D) region of a first transistor, and forming a second contact trench over a second S/D region of a second transistor. The method further includes forming a first S/D contact stack including a first contact trench liner in the first contact trench without forming the first contact trench liner in the second contact trench. The method further includes using the first S/D contact stack as a mask while forming a second contact stack including a second contact trench liner in the second contact trenches such that the second contact trench liner is blocked from depositing in the first contact trench. The first contact trench liner comprises a first liner material, and the second contact trench liner comprises a second liner material different than the first liner material.

According to yet another non-limiting embodiment, a complementary metal-oxide-semiconductor field-effect transistor (CMOS) device includes an active semiconductor layer including a first source/drain (S/D) region and a second S/D region different from the first S/D region. A first epitaxy film formed of a first semiconductor material is on the first S/D region. A second epitaxy film formed of a second semiconductor material is on the second S/D region. The CMOS device further includes first and second S/D contact stacks. The first S/D contact stack includes a first contact trench liner having a first base portion on the first epitaxy film and a first inner side wall extending from the first base portion to an upper surface of the first S/D contact stack. The second S/D contact stack includes a second contact trench liner having a second base portion on the second epitaxy film and a second inner side wall extending from the second base portion to an upper surface of the second S/D contact stack. The first inner sidewall directly contacts the second inner sidewall.

Additional features are realized through the techniques of the present invention. Other embodiments are described in detail herein and are considered a part of the claimed invention. For a better understanding of the invention with the features, refer to the description and to the drawings.

DETAILED DESCRIPTION

Figure 1:
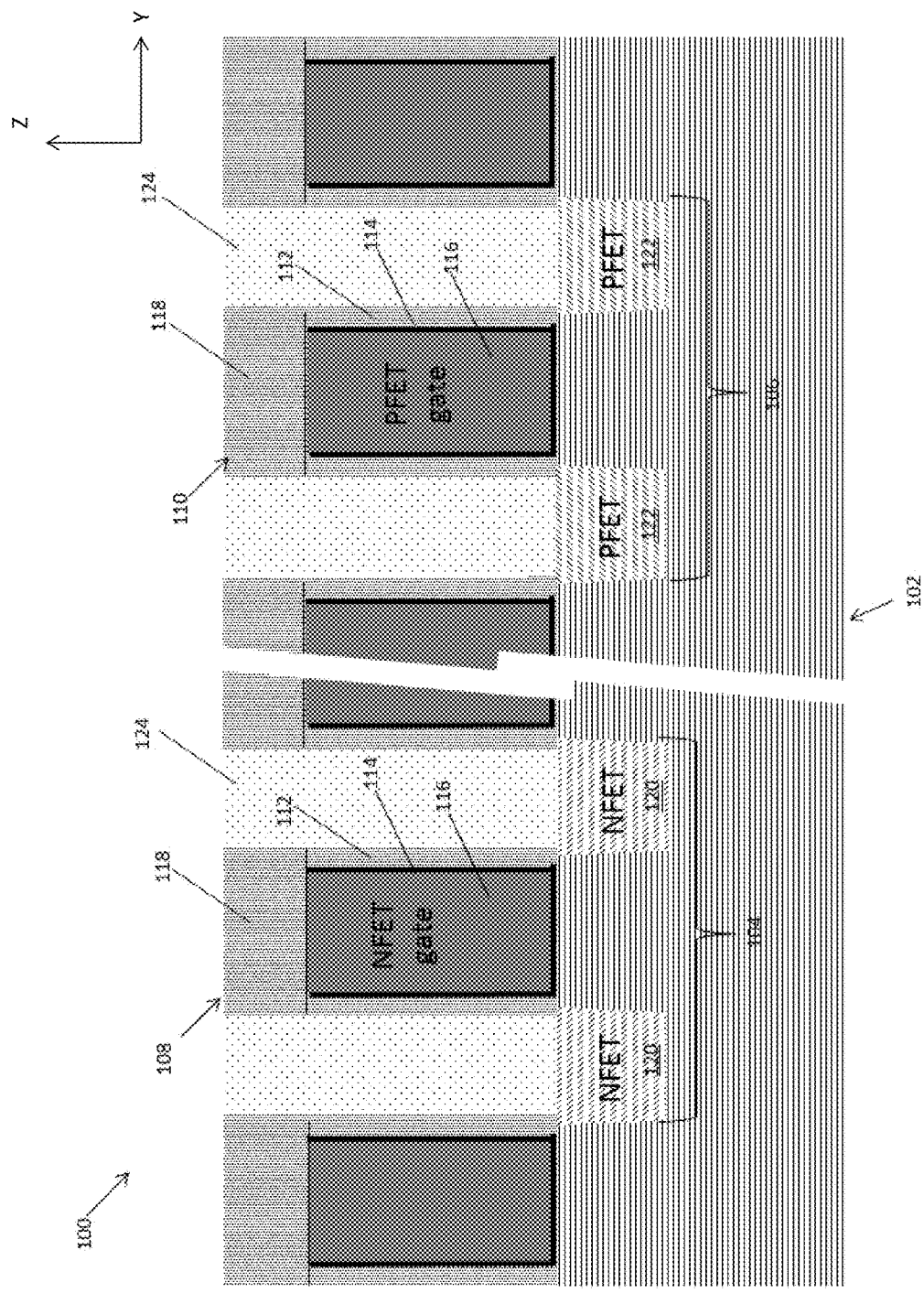
FIG. 1 illustrates an intermediate CMOS structure following a replacement metal gate (RMG) process that forms a plurality of isolated gate stacks including a conductive gate element formed between gate spacers, and a gate cap on the upper surface of each gate element.

Various embodiments of the present invention are described herein with reference to the related drawings. Alternative embodiments may be devised without departing from the scope of this invention. It is noted that various connections and positional relationships (e.g., over, below, adjacent, etc.) are set forth between elements in the following description and in the drawings. These connections and/or positional relationships, unless specified otherwise, may be direct or indirect, and the present invention is not intended to be limiting in this respect. Accordingly, a coupling of entities may refer to either a direct or an indirect coupling, and a positional relationship between entities may be a direct or indirect positional relationship. As an example of an indirect positional relationship, references in the present disclosure to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" may be understood to include any integer number greater than or equal to one, i.e., one, two, three, four, etc. The terms "a plurality" may be understood to include any integer number greater than or equal to two, i.e., two, three, four, five, etc. The term "connection" may include both an indirect "connection" and a direct "connection."

For the sake of brevity, conventional techniques related to semiconductor device and IC fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that may be utilized in implementing one or more embodiments of the present invention will now be provided. Although specific fabrication operations used in implementing one or more embodiments of the present invention may be individually known, the disclosed combination of operations and/or resulting structures of the present invention are unique. Thus, the unique combinations of the operations described in connection with the present invention utilize a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of the present invention, NiPt silicide source/drain (S/D) contact liners have proven to improve on-resistance ($R_{ON}$) for PFETs as discussed above. These NiPt silicide liners, however, are not as effective in reducing on-resistance when employed with NFETs. Because CMOS devices include both PFETs and NFETs, it is desirable to form a silicide liner comprising a different material (i.e., different from NiPt) in the NFET source/drain contact trenches.

CMOS processing is often different for NFETs versus PFETs. This is pertinent for silicide liners formed for landing contacts in both the NFETs and the PFETs. The dual silicide refers to the formation of silicide contact liners for both NFETs and PFETs in a single process flow. Conventional ways to form dual liner silicides forming a contact trench and depositing a first liner material for the NFET. Then, a mask is formed over the first liner material, and the first liner material is removed from the PFET. A second liner material is formed for the PFET. Then, metallization is formed from both the NFET and PFET. In this method, however, a metal liner is exposed to ash and the first liner material can undergo metal mixing with the PFET S/D regions.

In another method, a contact trench is formed followed by a first liner material being deposited, followed by a fill material (e.g., tungsten, or sacrificial material). The fill material and the first liner material are removed from the PFET. A second liner material is deposited and metallization is formed. In this method, as before, the first liner material can metal mix with the PFET S/D regions.

In still another method, contacts are formed for the NFET and the PFET. The NFET contacts are etched and a first liner and metal fill are formed. The PFET contacts are etched and a second liner and metal fill are performed. This method, however, requires at least two additional lithography steps which in turn increases overall costs.

Various non-limiting embodiments of the invention provide a CMOS device that includes dual-trench epitaxy dual-liner S/D contacts. The process flow includes performing a single trench etch to expose the PFET and NFET S/D regions, and then growing an epitaxy SiGe:B film on the exposed PFET S/D regions and the exposed NFET S/D regions. Because a SiGe:B film is deposited on both the PFET S/D and the NFET S/D regions, separate masking layers are not employed. The SiGe:B films deposited on the NFET regions are replaced with a different epi film such as, for example, a Si:P film. A first silicide liner comprising titanium (Ti), for example, is formed on sidewalls and the base of the PFET contact trenches. The PFET contact trenches are filled with a conductive material. The conductive material itself may act a mask such that the PFET contact trenches can be re-opened and a second silicide liner comprising nickel platinum (NiPt), for example, is formed on sidewalls and the base of the NFET contact trenches. Unlike conventional process flows, a single mask is used to achieve a CMOS device employing silicide liners made of different materials corresponding to the NFET and PFET, respectively. Accordingly, the number of masking layers and the number processing steps are reduced compared to conventional process flows.

Turning now to a more detailed discussion of one or more embodiments, with reference now to FIG. 1, an intermediate CMOS structure 100 is illustrated following a replacement metal gate (RMG) process. The CMOS structure 100 includes an active semiconductor layer 102 including one or more NFET devices 104 and one or more PFET devices 106. The active semiconductor layer 102 may be formed as a planar semiconductor substrate or a semiconductor fin, and may comprise various semiconductor materials including, but not limited to, silicon (Si). The active semiconductor layer 102 extends along a first axis (e.g., a Z-axis extending north and south) to define a height, a second axis (e.g., a Y-axis extending east and west) to define a width, and a third axis (e.g., X-axis extending into and out of the page—not shown) to define a length.

The CMOS structure 100 further includes an NFET gate stack 108 and a PFET gate stack 110. The NFET and PFET gate stacks 108-110 may each be formed, for example, by filling a dummy gate opening (not shown) located between gate spacers 112 with one or more high-k dielectric materials (not shown), one or more work function metals 114, and a conductive gate material 116. A gate cap 118 comprising silicon nitride (SiN), for example, is formed on the upper surface of the conductive gate material 116.

The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof. The high-k material may further include dopants such as, for example, lanthanum and aluminum.

The high-k dielectric material layer may be formed by known deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) 114 may be disposed over the high-k dielectric material. The type of work function metal (s) 114 can be selected based on the type of transistor (e.g., NFET or PFET). The work function metal(s) employed in the NFET differ from the work function meatal(s) employed in the PFET. Non-limiting examples of suitable work function metals 114 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal 116 is deposited over the high-k dielectric material(s) and work function layer(s) 114 to form the gate stacks 108-110. Non-limiting examples of suitable conductive metals 116 include aluminum, platinum, gold, tungsten, titanium, or any combination thereof. The conductive metal may be deposited by a known deposition process, for example, CVD, PECVD, PVD, plating, thermal or e-beam evaporation, sputtering, or sputtering.

Although the gate stacks 108-110 are illustrated as being implemented in a planar-type CMOS, it should be appreciated that the gate stacks 108-110 may be employed in a fin-type FET (finFET) device. For example, one or more fins (not shown) may be patterned in the active semiconductor layer 102 to form a FinFET device (not shown). The gate stacks 108-110 can be formed on an upper surface of the active semiconductor layer 102 so as to wrap around the fins. In other embodiments, a nanowire or stacked nanowires (not shown) can be patterned in the active semiconductor layer 102 to form a nanowire device. The gate stacks 108-110 are then formed so as to encapsulate all sides of the nanowire channels.

The CMOS structure 100 further includes NFET S/D regions 120 and PFET S/D regions 122 that are each formed in the active semiconductor layer 102. The NFET S/D regions 120 are formed on opposing sides of the NFET gate stacks 108, while the PFET S/D regions 122 are formed on opposing sides of the PFET gate stack 110. To form the S/D regions 120-122, an epitaxy process may be performed, for example, to grow a crystalline material in S/D wells (not shown) formed in the active semiconductor layer 102. The crystalline material includes, but is not limited to, Si, SiGe, and/or carbon doped silicon (Si:C). The crystalline material may be doped during deposition (i.e., in-situ doped) by adding a dopant or impurity during the epitaxy process to form a silicide material. The S/D regions 120-122 may be doped with an n-type dopant or a p-type dopant depending whether the S/D region 120-122 is used to form an NFET or a PFET as understood by one of ordinary skill in the art.

An inter-level dielectric (ILD) layer 124 is formed over and around the gate stacks 108-110 and S/D regions 120-122. The ILD layer 124 may be formed from, for example, a low-k dielectric oxide, including but not limited to, spin-on-glass, a flowable oxide, a high density plasma oxide, borophosphosilicate glass (BPSG), or any combination thereof. The ILD layer 124 may further comprise a nitride liner (not shown) that is deposited before depositing the ILD layer 124. The ILD layer 124 may be deposited by a suitable deposition process, including, but not limited to CVD, PVD, plasma enhanced CVD, atomic layer deposition (ALD), evaporation, chemical solution deposition, or like processes.

Figure 2:
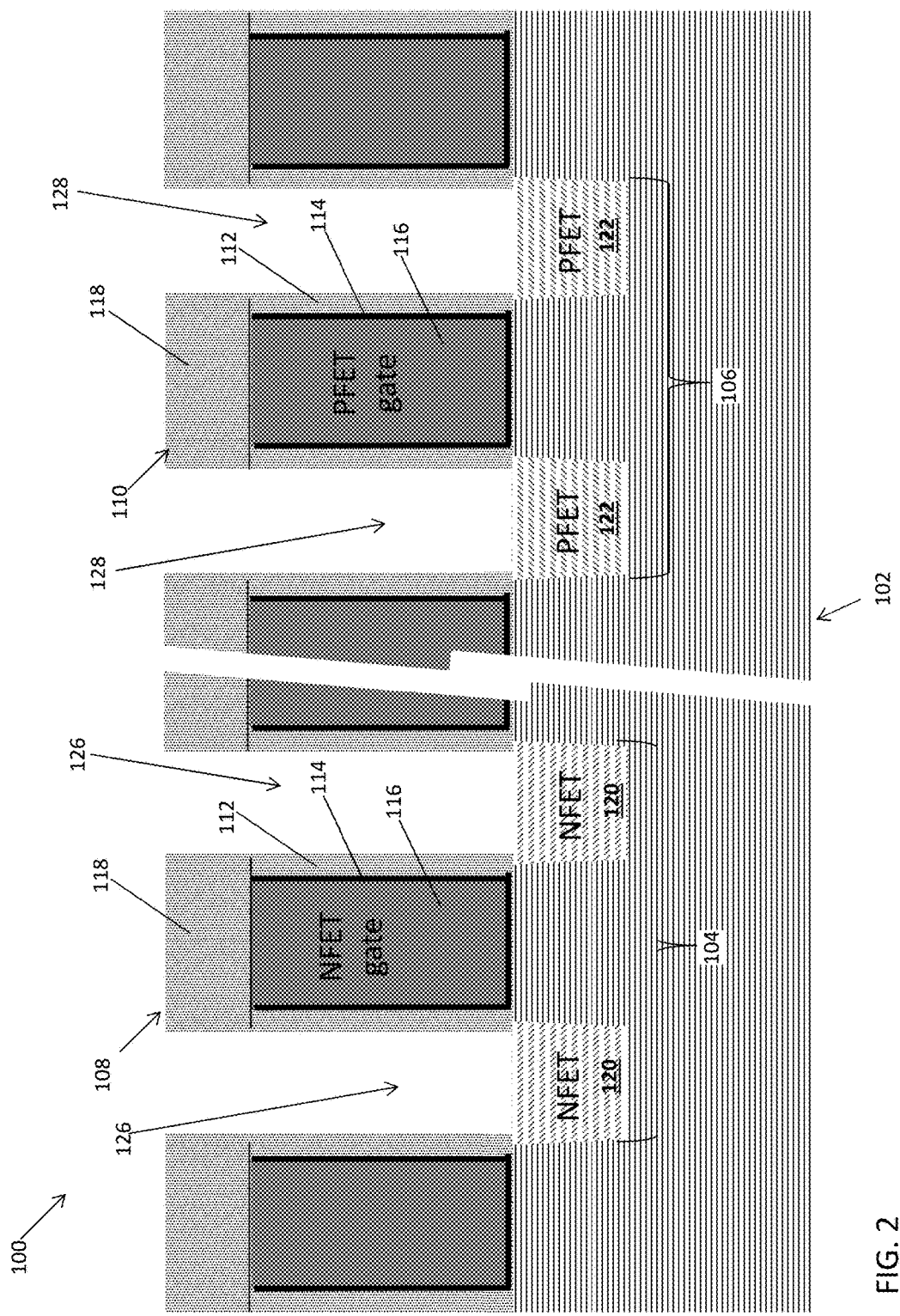
FIG. 2 illustrates the CMOS structure of FIG. 1 following a trench etching process that removes an inter-layer dielectric (ILD) material isolating the gate stacks to expose a set of NFET S/D regions and a set of PFET S/D regions.

Turning to FIG. 2, CMOS structure 100 is illustrated following removal of the ILD layer 124. As a result, NFET trenches 126 are formed which expose the NFET regions 120 and PFET trenches 128 are formed which expose the PFET regions 122. A two-step etching process may be performed to remove the ILD layers 124. First, an etching process that is selective to low-K materials may be used to remove the ILD layer 124 and stops on the upper surface of the S/D region caps 125. Thereafter, a second directional etching process is performed which attacks the cap material (e.g., SiN) to punch-through the S/D region caps 125 and expose the NFET regions 120 and PFET regions 122, respectively. It should be appreciated that the S/D region caps 125 have a smaller thickness than the gate caps 118. Accordingly, a portion of the gate caps 118 continues to remain atop the conductive material 116 following removal of the S/D region caps 125.

Figure 3:
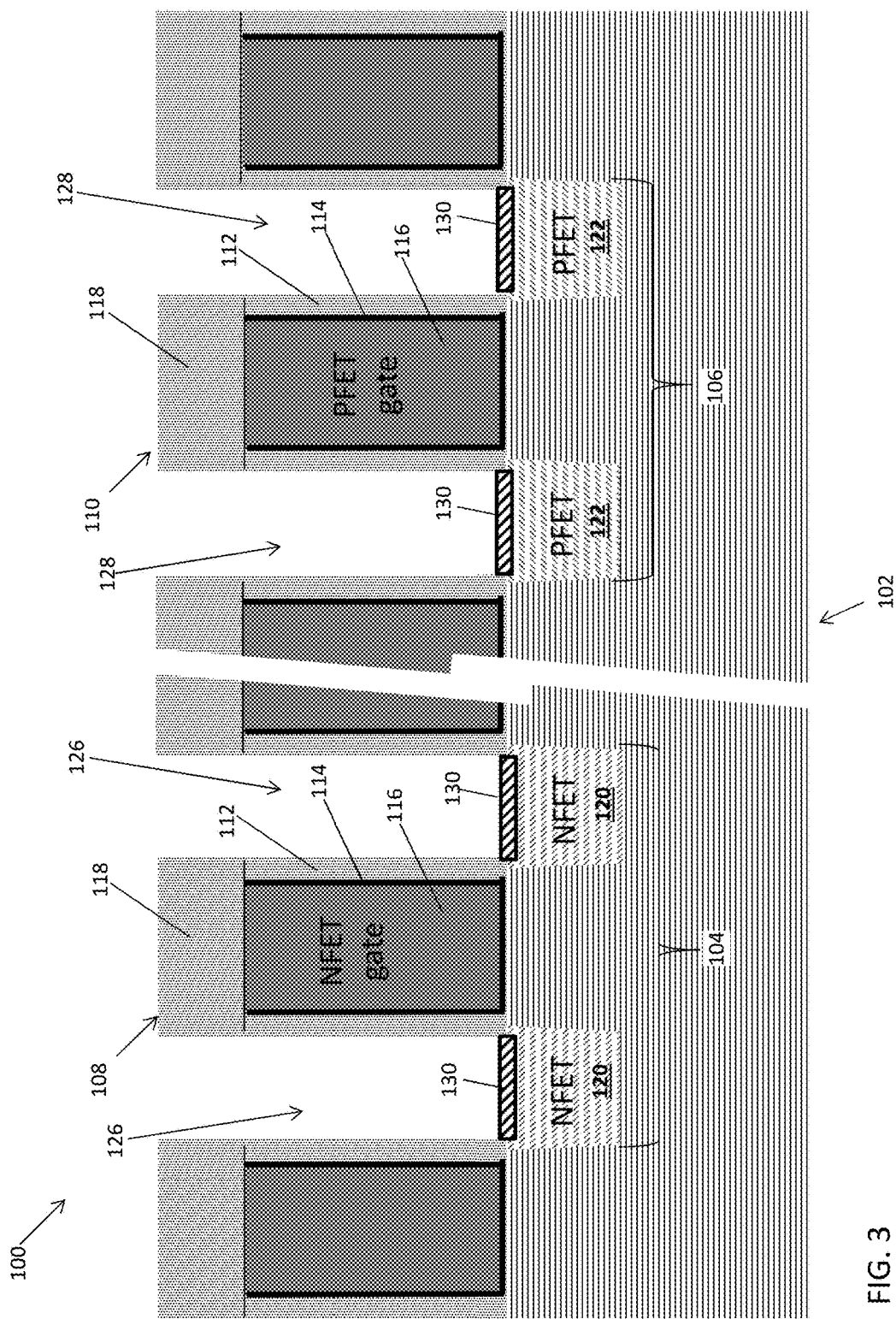
FIG. 3 illustrates the CMOS structure of FIG. 2 following formation of a first epitaxy (epi) film comprising a first semiconductor material on an upper surface of the NFET and PFET regions.

Referring to FIG. 3, a first epitaxy film 130 (i.e., epi film 130) comprising a first semiconductor material is formed on an upper surface of the NFET and PFET regions 120-122. The first epi film 130 formed on the NFET regions 120 and the PFET regions 122 has a thickness (i.e., distance along the Z-axis) ranging from approximately 1 nm to approximately 30 nm. The epitaxy process used to form the first epi film 130 may be carried out using vapor phase epitaxy (VPE), molecular beam epitaxy (MBE) or liquid phase epitaxy (LPE) with a gaseous or liquid precursor, such as, for example, silicon tetrachloride.

At this stage of the process flow, the first epi film 130 grown atop the NFET regions 120 and the PFET regions 122 comprises the same semiconductor material. For example, a SiGe:B epi film is grown atop both the NFET regions 120 and the PFET regions 122. Because a SiGe:B film is deposited on both the NFET S/D 120 and the PFET S/D region 122, it is unnecessary to perform multiple epi-film growth processes thereby reducing the number of masking layers employed in the overall process flow.

Figure 4:
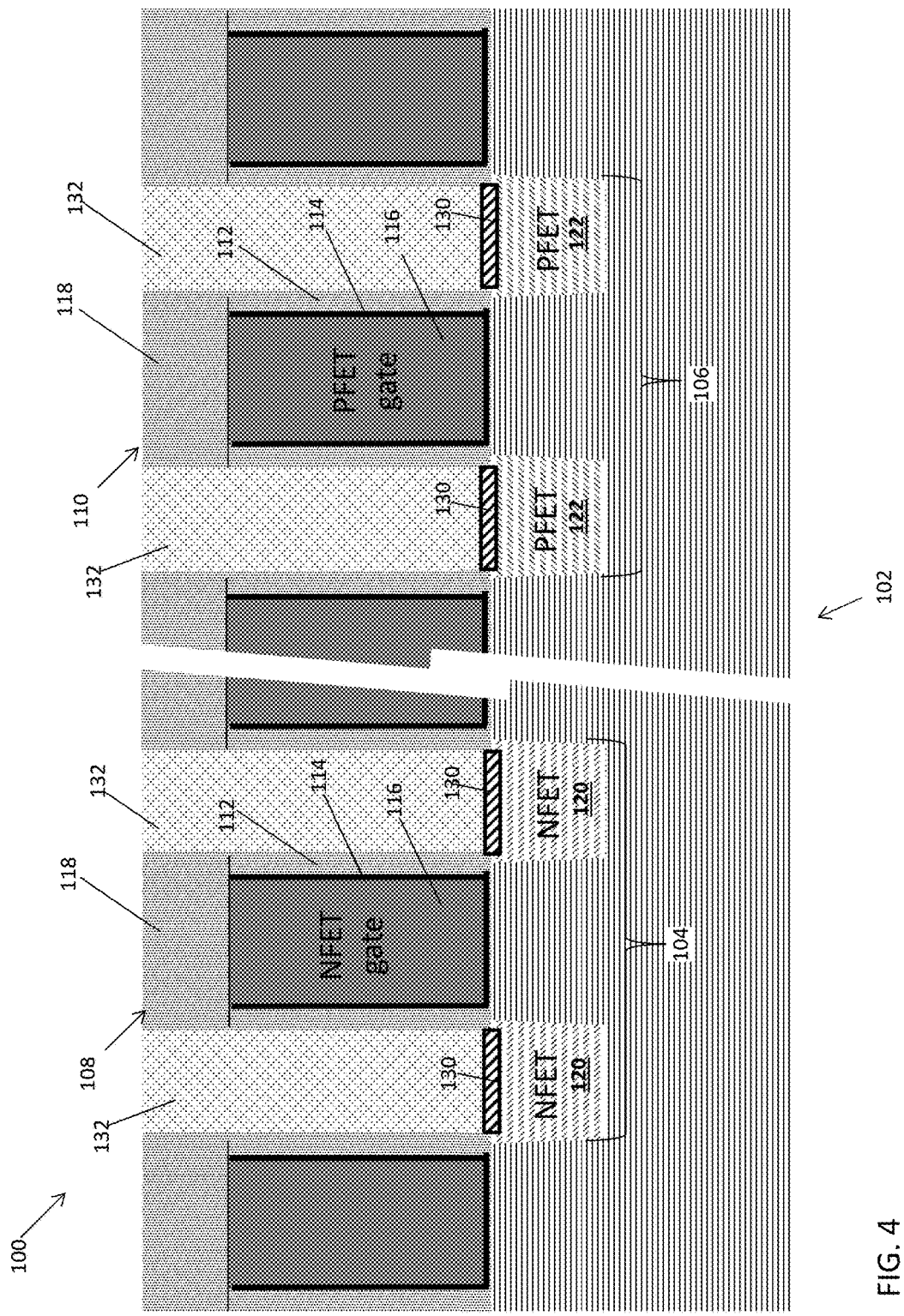
FIG. 4 illustrates the CMOS structure of FIG. 3, after filling the S/D trenches with a sacrificial material.

Referring now to FIG. 4, the CMOS structure 100 is illustrated after filling the S/D trenches (previously indicated as numerals 126-128) with a sacrificial trench material 132. A chemical-mechanical planarization (CMP) process is then performed such that the upper surface of the sacrificial material 132 is flush with the upper surface of the gate caps 118. The sacrificial trench material 132 may comprise various materials including, but not limited to, amorphous carbon (aC) and a low temperature oxide (LTO) material. The LTO material includes, but is not limited to, aluminum oxide ($AlO_x$), silicon nitride (SiN), and silicon dioxide ($SiO_2$). A sacrificial trench material 130 comprising aC may be deposited using, for example, a plasma-enhanced chemical vapor deposition (PECVD) processes. A sacrificial trench material 130 comprising LTO may be deposited using, for example, an in situ radical assisted deposition (IRAD) process.

Figure 5:
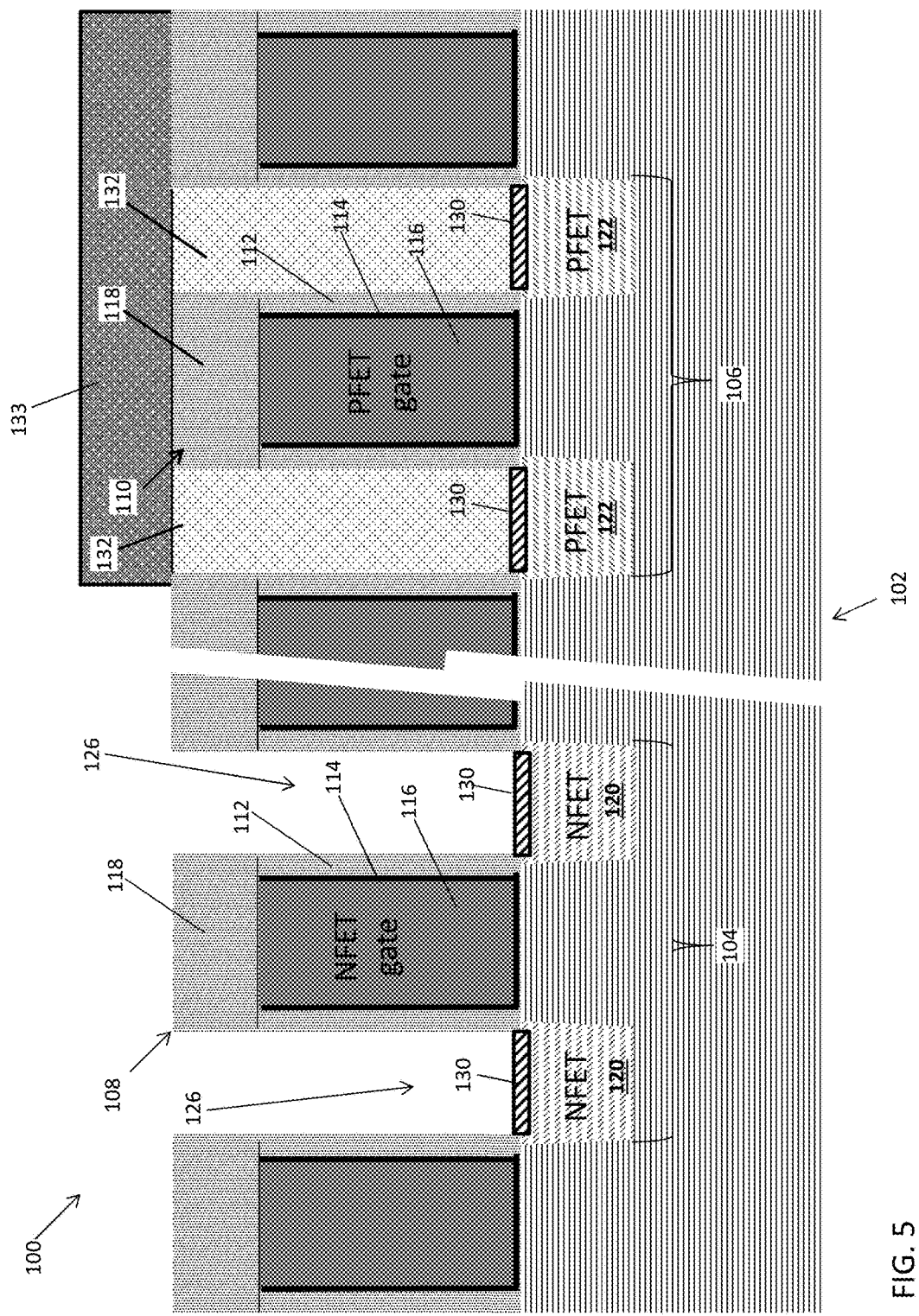
FIG. 5 illustrates the CMOS structure of FIG. 4 after re-opening the NFET trenches to expose the first S/D epi films formed on the NFET regions while maintain the sacrificial material in the PFET trenches.

Turning to FIG. 5, the NFET trenches 126 are re-opened to expose the first epi film 130 formed atop the NFET regions 120, while the sacrificial trench material 132 covering the PFET regions 122 is maintained. The sacrificial trench material previously filling the NFET trenches 126 may be etched with respect to the sacrificial trench material 132 filling the PFET trenches (previously indicated as numeral 128) by first covering the entire upper surface of the CMOS device 100 with a block hardmask 133. Thereafter, a lithography process may be performed to pattern the block hardmask 133 and expose the underlying sacrificial trench material 132 filling the NFET trenches 126 while maintaining coverage of the sacrificial material 132 filling the PFET trenches. After exposing the sacrificial trench material 132, a RIE process using a chemistry that attacks only the exposed sacrificial trench material 132 may be performed to re-open the NFET trenches 126. Because the PFET section of the CMOS device 100 remains covered by the hardmask, the sacrificial trench material 132 filling the PFET trenches remains intact.

Figure 6:
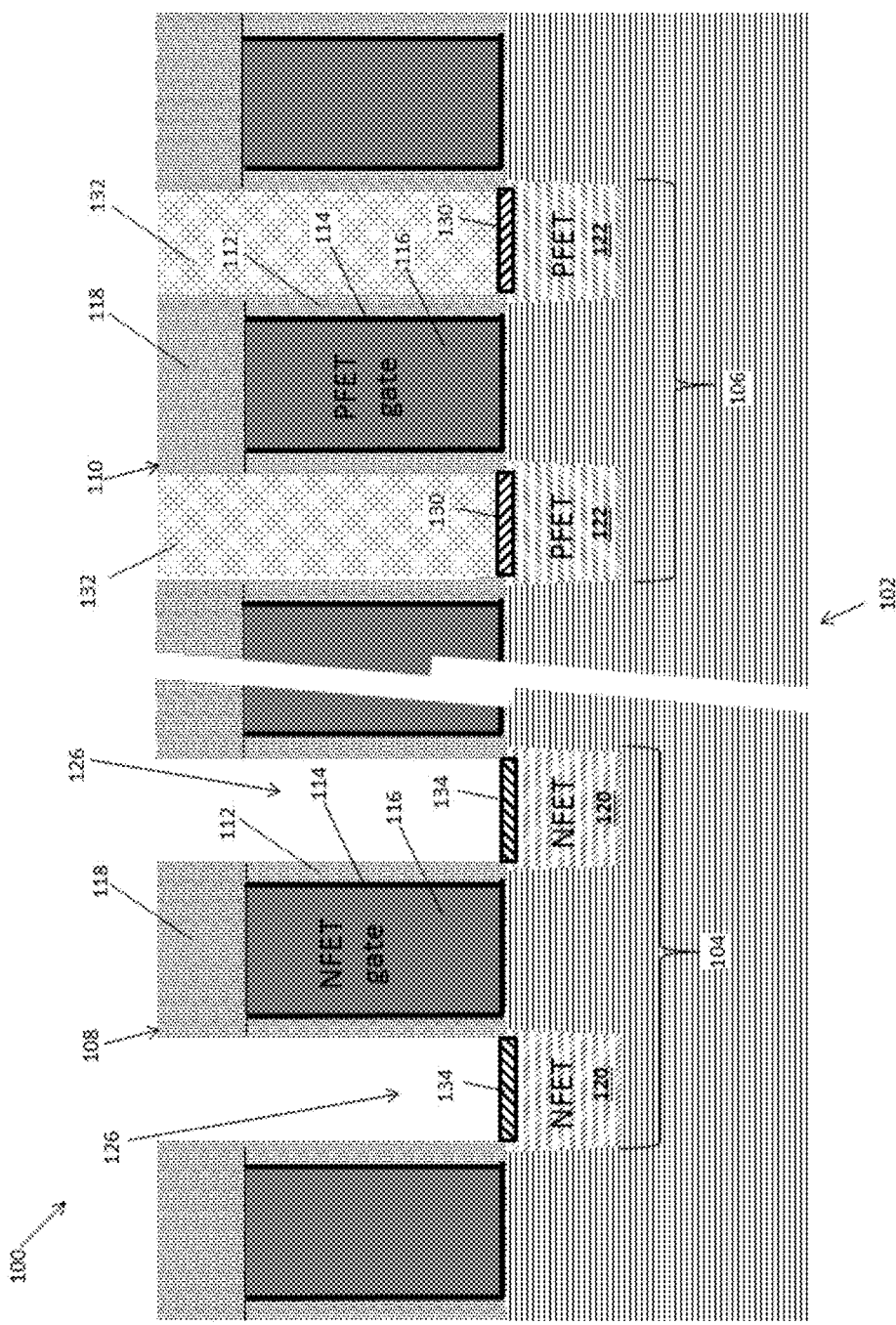
FIG. 6 illustrates the CMOS structure of FIG. 5 after re-opening the NFET trench and replacing the first S/D epi film formed on the NFET regions with a second S/D epi film comprising a second semiconductor material different from the first semiconductor material.

With reference now to FIG. 6, the CMOS device 100 is illustrated after replacing the first epi film (see FIG. 5) previously formed atop the NFET regions 120 with a second epi film 134. At this stage, the hardmask layer (previously indicated as numeral 133) can be stripped from the upper surface of the CMOS device 100. A hydrochloride (HCl) etchant can be used to strip the previously grown SiGe:B epi film and expose the upper surface of the NFET regions 120. Thereafter, a second epi film 134 comprising a second semiconductor material different from the first semiconductor material of the first epi film 130 is formed atop the NFET regions 120. The second epi film 134 may have a thickness (i.e., distance along the Z-axis) ranging from approximately 1 nm to approximately 30 nm. The second epi film 134 may be formed by epitaxially growing situ-doped phosphorus from an upper surface of NFET region to form a Si:P epi film 134 as further illustrated in FIG. 6.

Figure 7:
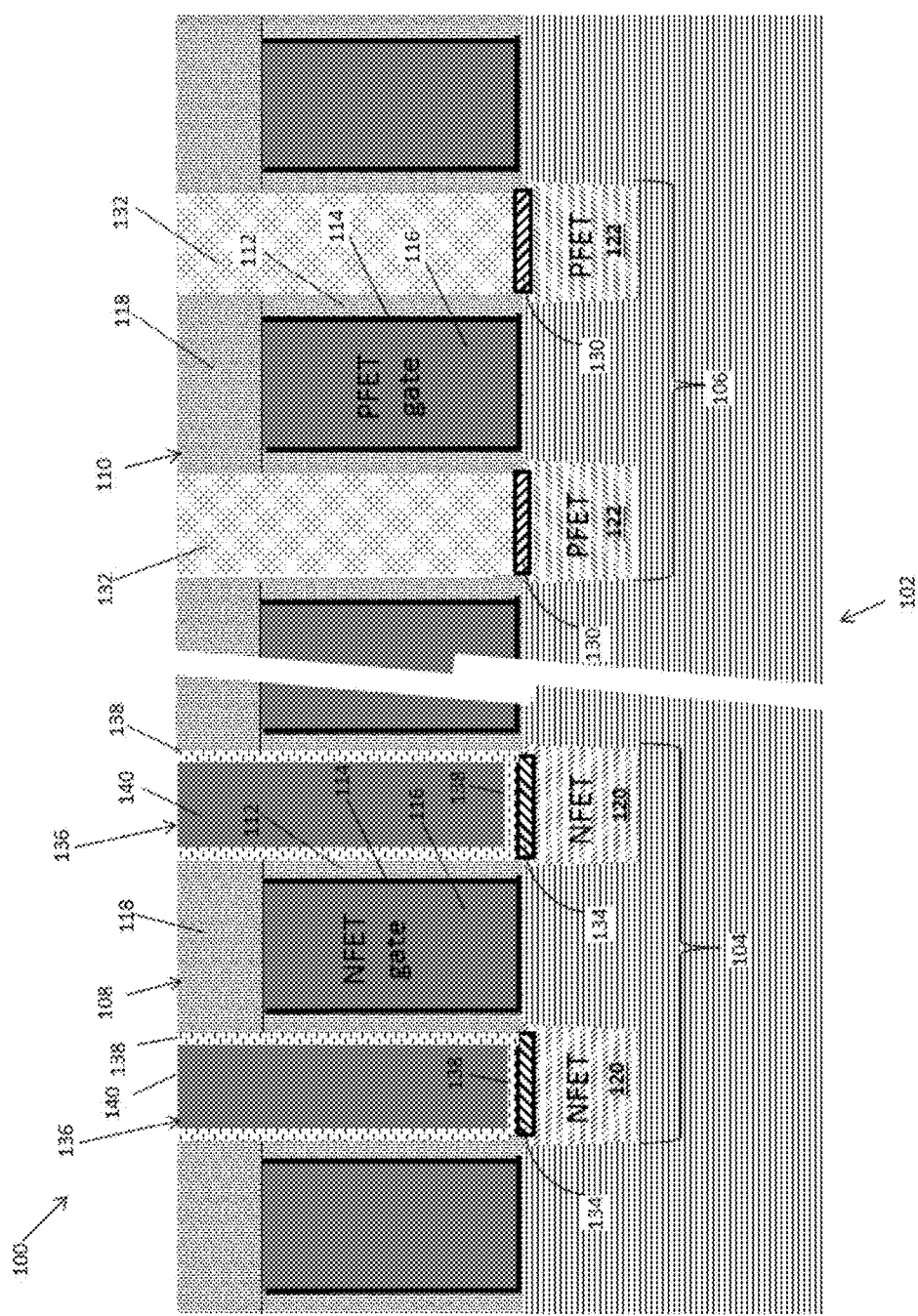
FIG. 7 illustrates the CMOS structure of FIG. 6 following a first silicide layer deposition process that deposits a first silicide layer on the sidewalls of the NFET trenches and after re-filling the NFET trenches with a conductive material.

Turning to FIG. 7, the CMOS device 100 is illustrated following formation of an NFET S/D contact stack 136 in the NFET trench (previously indicated as numeral 126.). The NFET S/D contact stack 136 includes a first contact trench liner 138 and a S/D conductive contact material 140. The total thickness of the first contact trench liner 138 may generally vary and is not intended to be limited. In one aspect, the total thickness of the first contact trench liner 138 ranges, for example, from approximately about 1 to approximately 15 nm.

The first contact trench liner 138 comprises a material that provides a low contact resistance (e.g., a contact resistance lower than $1 \times 10-8$ ohm·cm2) when deposited on the NFET regions 120. The first contact trench liner 138 comprises, for example, titanium (Ti). Although a single-layer contact trench liner 138 is illustrated, it should be appreciated that the first contact trench liner 138 may include one more than one layer. In this case, for example, the contact trench liner 138 may comprises a layer of Ti and a layer of titanium nitride (TiN). The first contact trench liner 138 may be formed by a chemical vapor deposition process (CVD), atomic layer deposition (ALD), or other suitable process.

The S/D conductive contact material 140 preferably comprises tungsten (W), but may be formed of various other materials including, but not limited to, aluminum (Al), platinum (Pt), gold (Au), titanium (Ti), or any combination thereof. The conductive contact material 140 may be deposited by a known deposition process, for example, CVD, PECVD, PVD, plating, thermal or e-beam evaporation, and sputtering. A CMP process may be performed following deposition of the first contact trench liner 138 and the S/D conductive contact material 140 to planarize the upper surface of the CMOS device 100 as further illustrated in FIG. 7.

Accordingly, the process flow forms a S/D contact stack (e.g., the NFET S/D contact stack 136) of a one transistor (e.g., the NFET) before opening the trenches corresponding to the remaining transistor (in this case the PFET). In this manner, the first contact stack 136 itself may act as a mask when forming the second S/D contact stack. For instance, a first contact liner 138 is formed in the NFET contact trenches 126 without depositing any contact liners in the PFET trenches. In this manner, a single mask may be utilized to form contact trench liners comprising different materials as discussed in greater detail below. Forming a liner in only one of the contact trenches at this stage of the process flow also eliminates the need to perform a subsequent etching process necessary to strip and replace a portion of the first contact trench liner with a second contact liner comprising a different material than the first contact liner.

Figure 8:
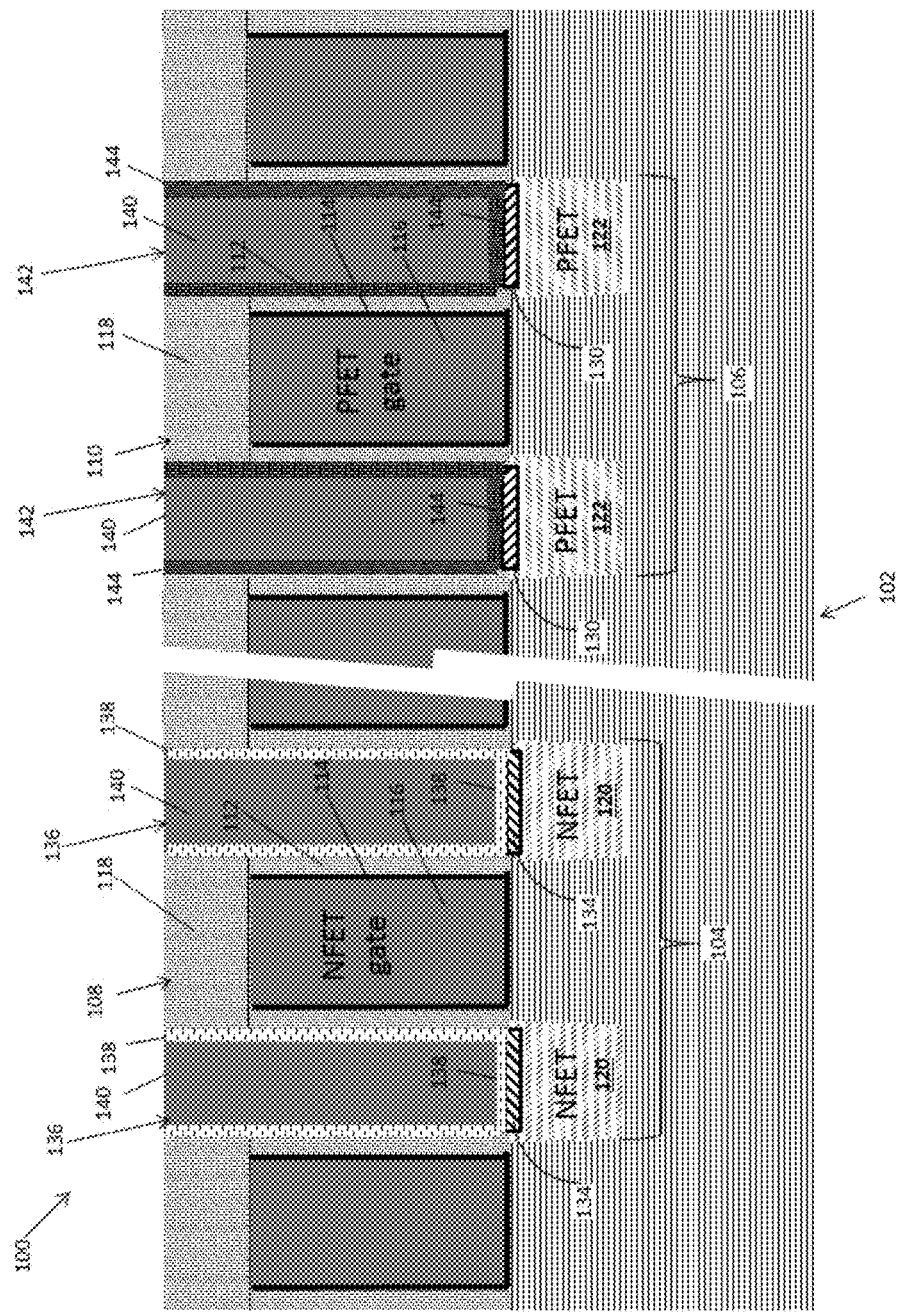
FIG. 8 illustrates the CMOS structure of FIG. 7 after re-opening the PFET trenches, and depositing a second silicide layer on the sidewalls of the PFET trenches and after depositing a conductive material in the PFET trenches to form a CMOS device including dual-trench epitaxy dual-liner S/D contacts.

Turning to FIG. 8, the remaining sacrificial trench material 132 covering the PFET regions 122 is replaced with a PFET S/D contact stack 142. The PFET S/D contact stack 142 is formed using similar process flow steps described above. The remaining sacrificial trench material 132 covering the PFET regions 122 may be etched away without employing an additional mask to cover the NFET section of the CMOS device 100 because the materials of the NFET contact stack 136 withstand the aC etching chemistry. Therefore, the NFET contact stack 136 itself can be utilized as a mask to protect the NFET section of the CMOS device 100 while the PFET trenches (previously indicated as numeral 128) are re-opened.

The PFET S/D contact stack 142 includes a second contact trench liner 144 and a S/D conductive contact material 140. The total thickness of the second contact trench liner 144 may generally vary and is not intended to be limited. In one aspect, the total thickness of the second contact trench liner 144 ranges, for example, from approximately about 1 to approximately 15 nm.

The second contact trench liner 144 comprises a material that provides a low contact resistance (e.g., a contact resistance lower than $1 \times 10^{-8}$ ohm·cm2) when deposited on the PFET regions 122. Because the electrical properties of the PFET regions 122 differ from the electrical properties of the NFET regions 120, the second contact trench liner 144 comprises different materials than the first contact liner 138. The second contact trench liner 144 comprises, for example, nickel platinum (NiPt). Although a single-layer contact trench liner 144 is illustrated, it should be appreciated that the second contact trench liner 144 may include one more than one layer. In this case, for example, the second contact trench liner 144 may comprises a layer of NiPt, a layer of tantalum nitride (TaN), or a layer of titanium nitride (TiN). The second contact trench liner 144 may be formed by a chemical vapor deposition process (CVD), atomic layer deposition (ALD), or other suitable process.

Similar to the NFET contact stack 136, the S/D conductive contact material 140 preferably comprises tungsten (W), but may be formed of various other materials including, but not limited to, aluminum (Al), platinum (Pt), gold (Au), titanium (Ti), or any combination thereof. The S/D conductive contact material 140 may be deposited by a known deposition process, for example, CVD, PECVD, PVD, plating, thermal or e-beam evaporation, and sputtering. A CMP process may be performed following deposition of the first contact trench liner 144 and the S/D conductive contact material 140 to planarize the upper surface of the CMOS device 100 as further illustrated in FIG. 8.

Figure 9:
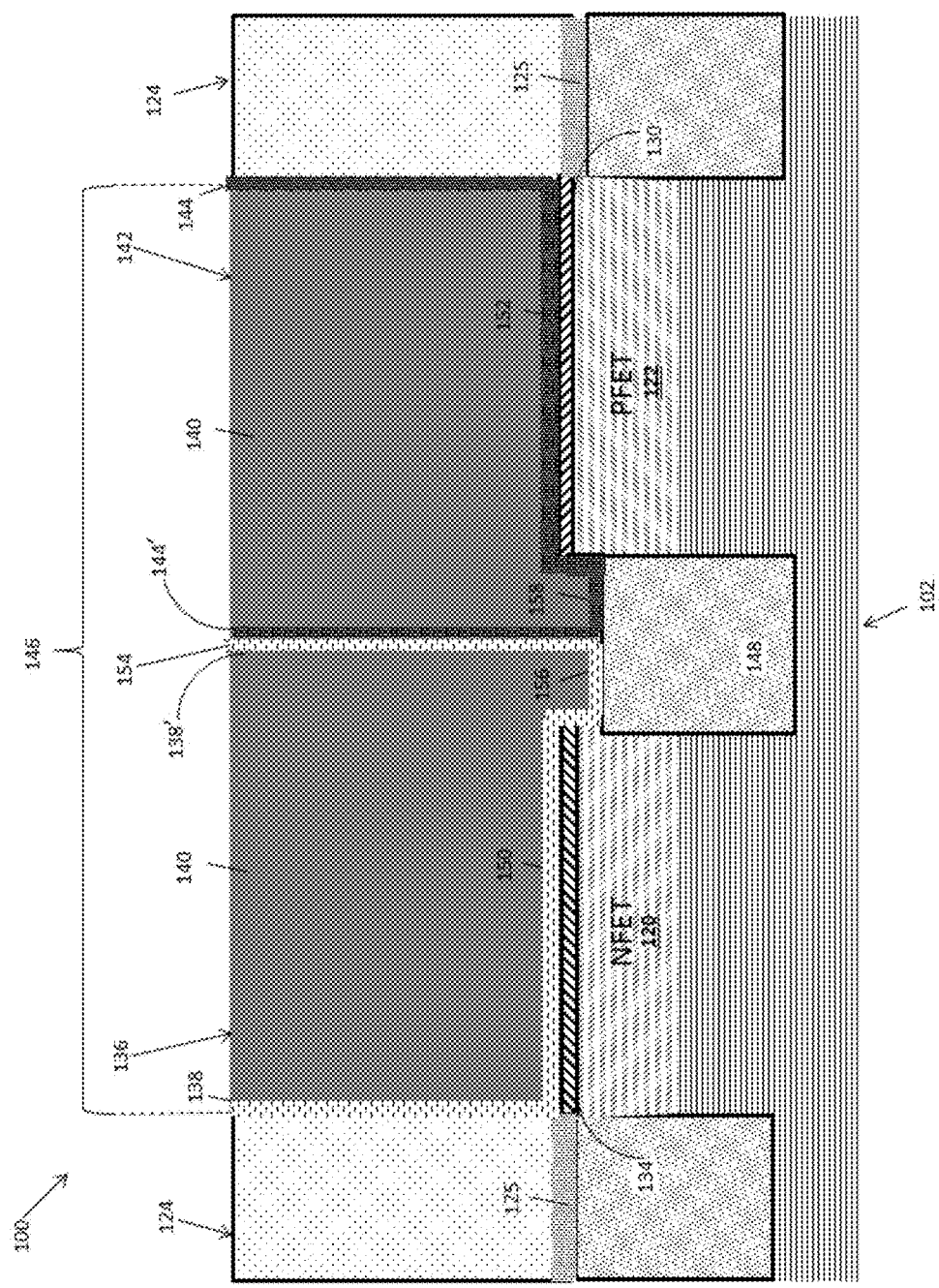
FIG. 9 is cross-sectional view of a shared contact included in a CMOS device according to a non-limiting embodiment.

Referring to FIG. 9, the CMOS device 100 may include a shared contact 146. The shared contact includes an NFET S/D contact stack 136 formed atop an NFET region 120 and a PFET S/D contact stack 142 formed atop the a PFET region 122. The NFET region 120 and the PFET region 122 are isolated from one another by an isolation region, e.g., a shallow trench isolation (STI) region 148.

The NFET S/D contact stack 136 includes a first contact trench liner 138 and a S/D conductive contact material 140. The first contact trench liner 138 comprises Ti, for example, and is configured to reduce the on-resistance ($R_{ON}$) of the NFET S/D contact stack 136. The S/D conductive contact material 140 comprises, for example, tungsten (W), and is deposited in the NFET contact trench to cover the first contact trench liner 128. A Si:P epi film 134 is formed directly on an upper surface of the NFET region 120. Accordingly, a base portion 150 of the first contact trench liner 138 is formed directly on the upper surface of the Si:P film 134.

Similarly, the PFET S/D contact stack 142 includes a second contact trench liner 144 and a S/D conductive contact material 140. The second contact trench liner 144 comprises NiPt, for example, and is configured to reduce $R_{ON}$ of the PFET S/D contact stack 142. The S/D conductive contact material 140 comprises, for example, tungsten (W) and is deposited in a PFET contact trench to cover the second contact trench liner 144. A SiGe:B epi film 130 is formed directly on an upper surface of the PFET region 122. Accordingly, a base portion 152 of the second contact trench liner 144 is formed directly on the upper surface of the SiGe:B film 130.

Still referring to FIG. 9, the shared contact 146 has a unique structure resulting from the process flow steps described in detail above. For instance, a shared liner 154 is formed directly between the S/D conductive contact material 140 of the NFET contact stack 136 and the S/D conductive contact material 140 of the PFET contact stack 142. Conventional flow processes that use multiple masks to form S/D trench liners result in trench liners that are completely separated from one another. That is, the trench liner of the NFET region does not directly contact the trench liner of the PFET region.

Unlike, conventional CMOS devices that form the contact trench liners using multiple masks, a non-limiting embodiment of the invention provides a CMOS device 100 having a shared liner 154 that includes an inner sidewall 138' of the first contact liner 138 that directly contacts an inner sidewall 144' of the second contact liner 144.

For instance, the base portion 150 of the first contact liner 138 includes an extension 156 that extends below the base portion 150 and contacts an upper surface of the STI 148. The inner sidewall 138', extends vertically (i.e., along the Z-axis) from the extension 156, to an upper surface of the S/D conductive contact material 140 corresponding to the NFET S/D contact stack 136. Similarly, the base portion 152 of the second contact liner 144 includes an extension 158 that extends below the base portion 152 and contacts an upper surface of the STI 148. The inner sidewall 144' extends vertically (i.e., along the Z-axis) from the extension 158, to an upper surface of the S/D conductive contact material 140 corresponding to the PFET S/D contact stack 142. Because only a single mask is used to form the first and second contact liners 138,144, the inner sidewall 138' of the first contact liner 138 (i.e., the NFET liner) directly contacts the inner sidewall 144' of the second contact liner 144 (i.e., the PFET liner) along the entire vertical distance extending from their respective extension regions 156,158, to the upper surface of the conductive material 140.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming contact trench liners in a complementary metal-oxide-semiconductor field-effect transistor (CMOS) device, the method comprising:
    forming a first contact trench over a first source/drain (S/D) region of an n-type transistor (NFET);
    forming a second contact trench over a second S/D region of a p-type transistor (PFET);
    forming a first epi film in both the first contact trench and the second contact trench and on both the first S/D region and the second S/D region;
    replacing the first epi film with a different second epi film in the first contact trench and on the first S/D region;
    depositing a first contact trench liner of the contact trench liners comprising a first liner material in the first contact trench without depositing the first contact trench liner in the second contact trench, and depositing a first S/D conductive contact material on the first contact trench liner and in the first contact trench; and
    after depositing the first contact trench liner, depositing a second contact trench liner of the contact trench liners comprising a second liner material in the second contact trench, and depositing a second S/D conductive contact material on the second contact trench liner and in the second contact trench,
    wherein the second liner material is different from the first liner material;
    wherein the first contact trench liner is deposited directly on and physically contacting an upper surface of the different second epi film located in the first contact trench, and the second contact trench liner is deposited directly on and physically contacting an upper surface of a remaining portion of the first epi film located in the second contact trench.

2. The method of claim 1, further comprising:
    filling the first contact trench and the second contact trench with a sacrificial material on the first epi film;
    depositing a mask layer atop the sacrificial material;
    removing a first portion of the mask layer to expose the sacrificial material filling the first contact trench while maintaining a second portion of the mask layer to cover the sacrificial layer filling the second contact trench;
    removing the exposed sacrificial material to form the first contact trench; and
    depositing the first contact trench liner in the first contact trench while the second portion of the mask layer covers the sacrificial layer filling the second contact trench.

3. The method of claim 2, wherein depositing the second contact trench liner comprises:
    using the first S/D conductive contact material as a hardmask while removing the sacrificial material from the second contact trench; and
    depositing the second contact trench liner in the second contact trench while the first S/D conductive contact material prevents depositing the second contact trench liner in the first contact trench.

4. The method of claim 2, wherein the sacrificial material comprises amorphous carbon.

5. The method of claim 2, wherein the sacrificial material comprises at least one of silicon dioxide, aluminum oxide, and silicon nitride.

6. The method of claim 1, wherein the first liner material comprises titanium (Ti).

7. The method of claim 6, wherein the second liner material comprises nickel platinum (NiPt).

8. The method of claim 7, wherein the first S/D conductive contact material and the second S/D conductive contact material each comprise tungsten (W).

9. A method of forming source/drain (S/D) contact stacks in a complementary metal-oxide-semiconductor field-effect transistor (CMOS) device, the method comprising:
    forming a first contact trench over a first source/drain (S/D) region of a first transistor;
    forming a second contact trench over a second S/D region of a second transistor;
    forming a first epi film in both the first contact trench and the second contact trench and on both the first S/D region and the second S/D region;
    replacing the first epi film with a different second epi film in the first contact trench and on the first S/D region;
    forming a first S/D contact stack of the S/D contact stacks including a first contact trench liner in the first contact trench without forming the first contact trench liner in the second contact trench; and
    using the first S/D contact stack as a mask while forming a second S/D contact stack of the S/D contact stacks including a second contact trench liner in the second contact trench such that the second contact trench liner is blocked from depositing in the first contact trench,
    wherein the first contact trench liner comprises a first liner material, and the second contact trench liner comprises a second liner material different from the first liner material,
    wherein the first contact trench liner is formed directly on and physically contacting an upper surface of the different second epi film located in the first contact trench, and the second contact trench liner is formed directly on and physically contacting an upper surface of a remaining portion of the first epi film located in the second contact trench.

10. The method of claim 9, further comprising:
    filling the first contact trench and the second contact trench with a sacrificial material on the first epi film;
    depositing a mask layer atop the sacrificial material;
    removing a first portion of the mask layer to expose the sacrificial material filling the first contact trench while maintaining a second portion of the mask layer to cover the sacrificial layer filling the second contact trench;
    removing the exposed sacrificial material to form the first contact trench;
    depositing the first contact trench liner in the first contact trench while the second portion of the mask layer covers the sacrificial layer filling the second contact trench; and
    filling the first contact trench with a first S/D conductive contact material to form the first S/D contact stack.

11. The method of claim 10, further comprising:
    using the first S/D contact stack as a hardmask while removing remaining sacrificial material to form the second contact trench;
    depositing the second contact trench liner in the second contact trench while the first S/D contact stack prevents depositing the second contact trench liner in the first contact trench; and
    filling the second contact trench with a second S/D conductive contact material to form the second S/D contact stack.

12. The method of claim 11, wherein the sacrificial material comprises amorphous carbon.

13. The method of claim 11, wherein the sacrificial material comprises a dielectric material comprising at least one of silicon dioxide, aluminum oxide and silicon nitride.

14. The method of claim 11, wherein the first liner material comprises titanium (Ti).

15. The method of claim 14, wherein the second liner material comprises nickel platinum (NiPt).

16. The method of claim 15, wherein the first transistor comprises an n-type transistor (NFET) and the second transistor comprises a p-type transistor (PFET).

17. The method of claim 16, wherein the first S/D conductive contact material and the second S/D conductive contact material each comprise tungsten (W).

* * * * *